United States Patent
Kim et al.

(10) Patent No.: US 8,288,830 B2
(45) Date of Patent: Oct. 16, 2012

(54) SEMICONDUCTOR DEVICE AND METHOD OF MANUFACTURING THE SAME

(75) Inventors: Jong-Min Kim, Guro-gu (KR); Jae-Hyun Yoo, Nam-gu (KR); Chan-Ho Park, Goyang-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 395 days.

(21) Appl. No.: 12/648,230

(22) Filed: Dec. 28, 2009

(65) Prior Publication Data

US 2010/0163981 A1    Jul. 1, 2010

(30) Foreign Application Priority Data

Dec. 30, 2008 (KR) .................. 10-2008-0137497

(51) Int. Cl.
*H01L 27/088* (2006.01)

(52) U.S. Cl. ........ 257/401; 257/288; 257/387; 257/408; 257/E29.256; 257/E29.04; 257/E29.268; 257/E29.269; 438/163

(58) Field of Classification Search .................. None
See application file for complete search history.

(56) References Cited

U.S. PATENT DOCUMENTS

| 5,338,960 | A | * | 8/1994 | Beasom | 257/335 |
| 2001/0028089 | A1 | * | 10/2001 | Adan | 257/347 |
| 2010/0078725 | A1 | * | 4/2010 | Hou et al. | 257/368 |

* cited by examiner

*Primary Examiner* — Benjamin Sandvik
*Assistant Examiner* — Leslie Pilar Cruz
(74) *Attorney, Agent, or Firm* — Sherr & Jiang, PLLC

(57) ABSTRACT

A semiconductor device includes: an active region defined by a device isolation layer on and/or over a substrate; a second conductive well on and/or over the active region; an extended drain formed at one side of the second conductive well; a gate electrode on and/or over the second conductive well and the extended drain; and a source and a drain formed at both sides of the gate electrode, in which extended regions are formed at the corners of the second conductive well under the gate electrode.

17 Claims, 1 Drawing Sheet

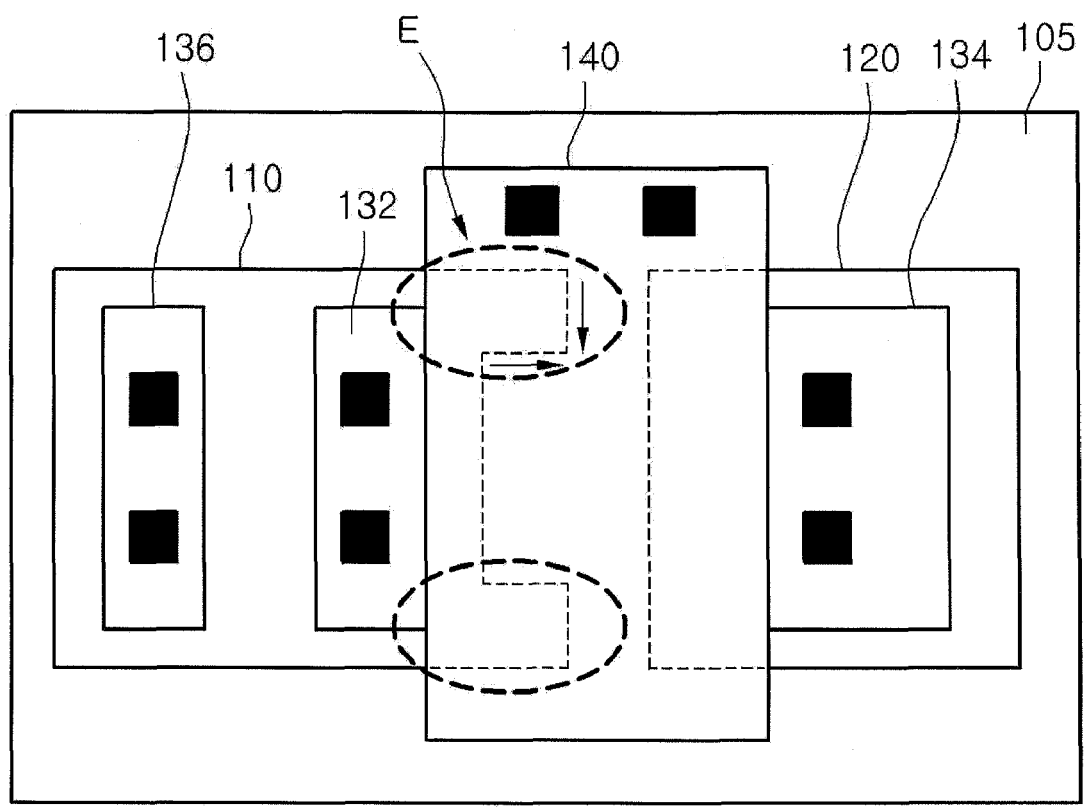

SEMICONDUCTOR DEVICE AND METHOD OF MANUFACTURING THE SAME

This application claims priority under 35 U.S.C. §119 to Korean Patent Application No. 10-2008-0137497 (filed Dec. 30, 2008), which is hereby incorporated by reference in its entirety.

BACKGROUND

There is a tendency that sub-threshold leakage increases with the increase in size of semiconductor devices, which is called a hump phenomenon. As in two MOSFETs in which characteristics of an active region and corners of a device isolation layer (STI) are different, the hump phenomenon causes high leakage current under threshold voltage of a semiconductor device due to low threshold voltage at the STI corner-sided channel, such that various methods have been proposed to prevent the problem.

For example, one related method of preventing the hump phenomenon involves implanting a boron ion to the side wall of a trench and of preventing the hump phenomenon by improving rounding characteristics of the joint of an active region and an STI region. Although it may be possible to prevent hump characteristics, there is a problem that using these related methods increases cost due to introducing an additional process, or increases the area of devices.

SUMMARY

Embodiments provide a semiconductor device and a method of manufacturing the semiconductor device which can prevent the hump phenomenon by changing the structure of a channel profile without changing the gate or active region itself in the structure of a semiconductor MOS device having an asymmetric channel profile.

A semiconductor device according to embodiments includes: an active region defined by a device isolation layer on a substrate; a second conductive well on and/or over the active region; an extended drain formed at one side of the second conductive well; a gate electrode on and/or over the second conductive well and the extended drain; and a source and a drain formed at both sides of the gate electrode, in which extended regions are formed at the corners of the second conductive well under the gate electrode.

Further, a method of manufacturing a semiconductor device according to embodiments includes: defining an active region on and/or over a substrate, using a device isolation layer; forming a second conductive well in the active region; forming an extended drain at one side of the second conductive well; forming a gate electrode on and/or over the second conductive well and the extended drain; and forming a source and a drain at both sides of the gate electrode, in which extended regions are formed at the corners of the second conductive well under the gate electrode

DRAWINGS

FIG. 1 is a plan view of a semiconductor device according to embodiments.

DESCRIPTION

Hereinafter, a semiconductor device according to embodiments and a method of manufacturing the semiconductor device will be described with reference to the accompanying drawings. In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

FIG. 1 is a plan view of a semiconductor according to embodiments. A semiconductor device according to embodiments includes: an active region defined by a device isolation layer 105 on and/or over a substrate; a second conductive well 110 on and/or over the active region; an extended drain 120 formed at one side of the second conductive well 110; a gate electrode 140 on and/or over the second conductive well 110 and the extended drain 120; and a source 132 and a drain 134 formed at both sides of the gate electrode 140, in which extended regions E are formed at the corners of the second conductive well 110 under the gate electrode 140. The extended regions E at the corners of the second conductive well may be formed by extending the corners of the second conductive well at the interface between the second conductive well 110 and the device isolation layer 105 under the gate electrode 140.

According to embodiments of a semiconductor device and a method of manufacturing a semiconductor device, it is possible to prevent a hump phenomenon by changing only the mask structure for controlling threshold voltage in the structure of a high-voltage MOS device having an asymmetric channel profile in the related devices. According to embodiments, there is an advantage of preventing the hump phenomenon, without deteriorating other characteristics and increasing cost due to introducing an additional process.

A method of manufacturing a semiconductor device according to embodiments will be described hereafter with reference to FIG. 1. First, an active region is defined on and/or over a substrate by a device isolation layer 105. The device isolation layer 105 may be an STI and an LCOS, etc. Subsequently, the second conductive well 110 may be formed in the active region. For example, although it is possible to form a P-type well or a Vt ion implantation region in the active region, it is not limited thereto. Embodiments of FIG. 1 are described by exemplifying an NMOS, but are not limited thereto.

Subsequently, the extended drain 120 may be formed at one side of the second conductive well 110. The gate electrode 140 may then be formed on the second conductive well 110 and the extended drain 120. The gate electrode 140 may include a gate dielectric layer and a gate. According to embodiments, the gate electrode 140 may be formed to overlap the second conductive well 110 and the extended drain 120. Subsequently, the source 132 and the drain 134 may be formed at both sides of the gate electrode 140.

Embodiments may include the extended regions E at the corners of the second conductive well under the gate electrode 140, in the second conductive well 110. In embodiments, the extended regions E at the corners of the second conductive well are formed by extending the corners of the second conductive well at the interface between the second conductive well 110 and the device isolation layer 105 under the gate electrode 140.

Further, the extended regions E at the corners of the second conductive well 110 may be formed such that the portions, at the corners of the gate channel in the width direction, of the second conductive well 110 protrude along the edge of the device isolation layer 105. Subsequently, a high-density region 136 may be formed at one side of the source 132 on the second conductive well 110. Thereafter, a contact process may be performed.

According to embodiments of a semiconductor device and a method of manufacturing a semiconductor device, it is possible to prevent a hump phenomenon by changing only the mask structure for controlling threshold voltage in the structure of a high-voltage MOS device having an asymmetric channel profile in the related art. According to embodiments, there is an advantage of preventing the hump phenomenon, without deteriorating other characteristics and increasing cost due to introducing an additional process.

Embodiments have a high-voltage NMOS structure, in which the p-well mask may overlap the source region and a predetermined region of the channel from the source region, in order to prevent yield voltage characteristics from being deteriorated by close disposition of the extended drain and the p-well region, which is the second conductive well 110, while adjusting a threshold voltage. As a result, the channel profile has an asymmetric channel profile in the channel region from the source to the drain 134 and the asymmetric channel profile makes it possible to ensure both characteristics of threshold voltage at the source end and yield voltage at the drain end.

Meanwhile, a portion of the P-well overlapping from the source can be formed to overlap the channel region by about 0.5~2.0μ, however, it may have a gradient profile in the length direction along the channel, because the ion-implanted edge is close to the source. The gradient profile may cause a large difference in threshold voltage between the center and the edge in the width direction by segregation at the joint between the active region and the device isolation layer (e.g., shallow trench isolation (STI), local oxidation of silicon (LOCOS)), and may be vulnerable to the hump.

Accordingly, embodiments provide a device that adjusts the threshold voltage by locally adjusting the density of the channel at the source end, in which it is possible to prevent reduction of the channel density at the corners by extending the second conductive well 110, for example, the p-well structure to protrude only at the corners in order to remove the problems due to the gradient profile. Forming the extended regions E only at the corners according to embodiments does not cause an additional process, because it does not influence the threshold voltage or the yield voltage of the device. The method of extending only the corners of the p-well as in described embodiments has an advantage of preventing the hump phenomenon by changing only the mask structure, without introducing an additional process.

Embodiments include a high-voltage semiconductor device that, for example, may be an MOS FET etc., which may be formed such that the second conductive well controlling threshold voltage or the vt ion implantation mask overlaps a predetermined portion of the gate. Further, in this configuration, predetermined portions at the width corners of the channel of the second conductive well or the vt ion implantation region may protrude along the corner edge of the device isolation layer, for example the STI.

Further, according to embodiments, not only the doping profile of the Vt or second conductive well 110 which controls threshold voltage is asymmetric in the length direction of the gate, but it is more asymmetric around the corners of the device isolation layer, such that it is possible to provide a structure of an MOS device having a two-dimensional threshold voltage adjustment channel profile. Further, according to the embodiment, the protruding extended region of the mask for controlling the threshold can overlap the active region by 0.1μ or more in the channel width direction. For example, it can overlap about 0.2~1.0μ.

Further, according to the embodiment, the protruding portion of the mask for controlling the threshold can overlap the active region by 0.1μ or more in the channel length direction. For example, it can overlap about 0.2~1.0μ. Further, embodiments can have a channel profile that is non-uniform in the channel length direction to adjust the threshold voltage and the yield voltage of the MOS device. Also, according to embodiments, the channel doping profile at the source end can have higher doping density than the channel doping profile at the drain end.

Further, embodiments can have a channel profile that is partially non-uniform in the channel length and width directions to adjust the threshold voltage, the yield voltage, and hump characteristics of the MOS device. According to embodiments of a semiconductor device and a method of manufacturing a semiconductor device, it is possible to prevent a hump phenomenon by changing only the mask structure for controlling threshold voltage in the structure of a high-voltage MOS device having an asymmetric channel profile as in related devices.

According to embodiments, there is an advantage of preventing the hump phenomenon, without deteriorating other characteristics and increasing cost due to introducing an additional process.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A device comprising:
    an active region defined by a device isolation layer over a substrate;
    a second conductive well over the active region;
    an extended drain formed at one side of the second conductive well;
    a gate electrode over the second conductive well and the extended drain; and
    a source and a drain formed at both sides of the gate electrode,
    wherein extended regions are formed at corners of the second conductive well under the gate electrode, wherein the extended regions at the corners of the second conductive well are formed by extending the corners of the second conductive well in a direction towards the extended drain at the interface between the second conductive well and the device isolation layer under the gate electrode, wherein said extending the corners leaves an unextended portion between the extended corners.

2. The device of claim 1, wherein the gate electrode is formed to overlap the second conductive well and the extended drain.

3. The device of claim 2, wherein the extended regions at the corners of the second conductive well are formed such that the portions, at the corners of the gate channel in the width direction, of the second conductive well protrude along the edge of the device isolation layer.

4. The device of claim 1, comprising a high-density region formed at one side of the source on the second conductive well.

5. The device of claim 1, wherein the device isolation layer is on the substrate.

6. The device of claim 1, wherein the second conductive well is on the active region.

7. The device of claim 1, wherein the gate electrode is on the second conductive well and the extended drain.

8. A method, comprising:
    defining an active region over a substrate, using a device isolation layer;
    forming a second conductive well in the active region;
    forming an extended drain at one side of the second conductive well;
    forming a gate electrode over the second conductive well and the extended drain; and
    forming a source and a drain at both sides of the gate electrode,
    wherein extended regions are formed at corners of the second conductive well under the gate electrode,
    wherein the extended regions at the corners of the second conductive well are formed by extending the corners of the second conductive well in a direction towards the extended drain at the interface between the second conductive well and the device isolation layer under the gate electrode, wherein said extending the corners leaves an unextended portion between the extended corners.

9. The method of claim 8, wherein the gate electrode is formed to overlap the second conductive well and the extended drain.

10. The method of to claim 9, wherein the extended regions at the corners of the second conductive well are formed such that the portions, at the corners of the gate channel in the width direction, of the second conductive well protrude along the edge of the device isolation layer.

11. The method of claim 8, comprising forming a high-density region at one side of the source on the second conductive well.

12. A method, comprising:
    defining an active region on a substrate, using a device isolation layer;
    forming a second conductive well in the active region;
    forming an extended drain at one side of the second conductive well;
    forming a gate electrode on the second conductive well and the extended drain; and
    forming a source and a drain at both sides of the gate electrode,
    wherein extended regions are formed at corners of the second conductive well under the gate electrode,
    wherein the extended regions at the corners of the second conductive well are formed by extending the corners of the second conductive well in a direction towards the extended drain at the interface between the second conductive well and the device isolation layer under the gate electrode, wherein said extending the corners leaves an unextended portion between the extended corners.

13. The method of claim 12, wherein the gate electrode is formed to overlap the second conductive well and the extended drain.

14. The method of to claim 13, wherein the extended regions at the corners of the second conductive well are formed such that the portions, at the corners of the gate channel in the width direction, of the second conductive well protrude along the edge of the device isolation layer.

15. The method of claim 12, comprising forming a high-density region at one side of the source on the second conductive well.

16. The method of claim 12, wherein the device isolation comprises shallow trench isolation.

17. The method of claim 12, wherein the device isolation layer comprises local oxidation of silicon.

\* \* \* \* \*